March 4, 1969 P. P. CASTRUCCI ET AL 3,431,472

PALLADIUM OHMIC CONTACT TO SILICON SEMICONDUCTOR

Original Filed July 7, 1966

INVENTORS
PAUL P. CASTRUCCI
RAYMOND P. PECORARO

BY George D. Saile
ATTORNEY 3,431,472
PALLADIUM OHMIC CONTACT TO SILICON SEMICONDUCTOR Paul P. Castrucci, Poughkeepsie, and Raymond P. Pecoraro, Wappingers Falls., N.Y., assignors to International Business Machines Corporation, Armonk, N.Y., a corporation of New York Continuation of application Ser. No. 563,418, July 7, 1966, which is a continuation-in-part of application Ser. No. 334,748, Dec. 31, 1963. This application Oct. 17, 1967, Ser. No. 675,866
U.S. Cl. 317—234 6 Claims
Int. Cl. H01l 3/00, 5/00

ABSTRACT OF THE DISCLOSURE

A method for forming ohmic contacts to a silicon body which includes first depositing the mineral onto the desired contact regions of a silicon body. The deposition is controlled such that the silicon body is maintained below the eutectic alloy temperature of the metal and the silicon body and in a temperature range of between 100° F. and 1530° F. The silicon body with the metal layer thereon is heated to a sintering temperature below the eutectic alloy temperature of the metal and silicon within the range of 400° F. to 1530° F. for a period of time sufficient to form a strong bond between the metal and the silicon body.

Cross-reference to related application

This application is a continuation of copending United States patent application Ser. No. 563,418 filed July 7, 1966. The United States patent application Ser. No. 563,418 is a continuation-in-part of copending patent application, Ser. No. 334,748 filed Dec. 31, 1963.

This invention relates to ohmic contacts and to fabrication methods therefor, and more particularly relates to an ohmic contact for semiconductor silicon yielding superior high temperature and other properties.

Contacts between a metal and a semiconductor are of two basic types: ohmic and nonohmic. At a contact between a metal and a semiconductor there will be an abrupt discontinuity of the lattice structure. If the curve of the electrical resistance is linear and has an equal slope on both sides of this discontinuity, the contact is ideally ohmic. If the curve is seriously nonlinear, the contact is nonohmic and may have use as a rectifying contact.

In practical semiconductor-diode or transistor device fabrication, the term ohmic contact will functionally describe any contact which allows charge carriers to move freely into and out of the device and does not interfere with the operation of the device. It is very difficult to make completely linear ideal ohmic contacts as described above. For purposes of this specification an ohmic contact shall, therefore, be one having substantially linear properties so that no substantial extraneous circuit effect is added by the contact.

Contacts in general are not well understood, particularly compared to junctions. Many unexpected effects are encountered in contacts depending upon the nature of the materials, the nature of their impurities, the exact history of their fabrication, and the precise nature of the contacting surfaces. It is, therefore, difficult to anticipate whether or not a contact will be ohmic, and what other properties it will have. To be sure, atomic models of the energy relationships of the metal and semiconductor lattices in a contact are well known and certain predictions can be hazarded therefrom. But in general, contact phenomena are often not accurately predicted by recognized energy model methods.

For example, elementary barrier-layer theory would indicate that it is possible to make an ohmic contact if one chooses the correct relationship between the metal work function and that of the semiconductor. This relationship would require the choice of a metal of work function smaller that that of the semiconductor for n-type semiconductors, and one of work function larger than that of the semiconductor for p-type semiconductors. However, this prediction is by no means wholly borne out in practice.

The complicated interactions of band structures at a contact affect directly the mobility of charge carriers across the discontinuity. Consequently, no totally satisfactory predictive tools are known that allow the properties of any metal to semiconductor contact to be predicted with certainty before it is tried experimentally. This follows directly from the difficulty in foreseeing all effects of the aforesaid complex band structure interactions.

Within the context of this difficulty with metal to semiconductor contacts, subsidiary problems exist. One specific problem to which the present invention is addressed, is the difficulty in forming an ohmic contact with n-type silicon that has good mechanical properties and good high temperature reliability. It is presently known to the art that aluminum forms a contact with n-type silicon that is a superior contact insofar as ohmic properties are concerned. However, the aluminum-silicon contact has a number of important drawbacks that spoil its attractiveness based on its good ohmic properties.

For one thing, the practical processing required to form an aluminum-silicon contact is more tedious and wasteful than present-art techniques would otherwise necessitate. It is known to evaporate metal contacts onto a semiconductor using a mask. However, this highly advantageous technique cannot, in practical circumstances, be practiced at very high temperatures because of deleterious effects on the constituents, which as was already seen, have unpredictable effects on the characteristics of the contact obtained.

Thus, for example, a silicon substrate temperature of 400° F. is deemed practical and advantageous during evaporation. However, in order for aluminum to be evaporated onto silicon successfully, the silicon substrate must be at approximately 1100° F. or slightly above the aluminum-silicon eutectic temperature of 1070° F. Thus evaporation of aluminum produces substantial alloying. As is well known, such alloying is injurious to the finished semiconductor by, for example, producing shorted junctions. Because of this notorious difficulty with aluminum-silicon contacts, the advantageous evaporation technique cannot be practiced, and the tedious wasteful selective removal techniques are instead employed.

Another difficulty with such aluminum-silicon contact is that the eutectic temperature of 1070° F. is appreciably below advantageous subsequent processing temperatures. Thus, subsequent processing of the device must proceed at temperatures somewhat below 1070° F. in order to preserve the contact, and although doing so often hampers the best execution of such subsequent processing. Moreover, what applies to processing temperatures also applies to operating temperatures.

A most exasperating problem with aluminum-silicon contacts is that although aluminum will accept compression bonding with gold wires, the bond thereby produced is extremely brittle, and the bond is known in the art as having the "purple plague." It is well known that compression bonding gold leads to a contact metal layer is advantageous and the unreliability mechanically and thus electrically of the bond having the "purple plague" is often accepted as the price for employing aluminum as a contact metal together with the advantageous gold wire leads.

An additional problem associated with past ohmic contacts, such as an aluminum-silicon contact, is that these contacts were formed at high temperatures thereby causing PN junctions to shift or caused an aluminum-silicon alloying effect which could penetrate to the junctions and thereby cause shorting. This is especially important where high speed semiconductor devices are utilized which require thin semiconductor regions. Accordingly, it is desirable to form ohmic contacts at temperatures significantly below the alloying temperature (solid-liquidus formation) so that alloying will not take place and movement of carriers is minimized.

Despite the difficulties enumerated, that is, (1) the unreliability problem related to alloying, (2) the necessity of employing tedious and wasteful selective removal fabrication techniques, (3) the necessity for low subsequent processing temperatures, (4) the production of unreliable bonds with gold wires due to the "purple plague," and (5) the problem in forming ohmic contacts with shifting PN junctions and shorting caused by penetrating alloyed regions; the use of aluminum contacts with silicon is nevertheless commonly practiced simply because aluminum forms a superior contact with silicon insofar as ohmic properties are concerned.

What has been needed in this specific segment of the contact art is thus clear: a contact for silicon, particularly n-type silicon, that has as good or better ohmic properties as aluminum-silicon with none of the aforesaid drawbacks thereof. Such a contact would relieve the present necessity of paying the price of weight structual and processing disadvantages in order to obtain the benefits of ohmic properties.

It is accordingly the principal object of the present invention to provide a silicon structure having an ohmic contact thereto characterized by greater electrical and mechanical reliability and higher possible processing and operating temperatures than was heretofore possible in combination.

Another object of the invention is to provide an improved method for forming an ohmic contact to a silicon structure.

Another object of the invention is to provide a silicon NPN semiconductor structure having ohmic contacts with superior processing and operating properties.

Another object of the invention is to provide such a structure wherein both the application of the metallic portion of the contact and subsequent processing steps are rendered simpler and more economical than was heretofore possible.

Another object of the invention is to provide such a structure wherein ohmic properties comparable to those obtainable employing aluminum are combined with production by evaporation techniques together with compression bonded gold leads, without occurrence of junction shorting due to alloying or unreliable bonding due to "purple plague" brittleness.

The foregoing and other objects, features and advantages of the invention will be apparent from the following more particular description of a preferred embodiment of the invention, as illustrated in the accompanying drawings.

Figure 1:
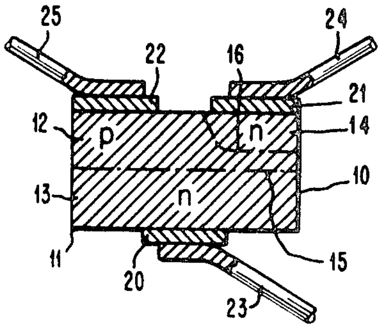
FIG. 1 is a partially sectioned view of one form of transistor having contacts fabricated in accordance with the invention.

Referring now specifically to the drawings, the transistor indicated generally at 10 in FIG. 1 includes a silicon wafer 11 which has been properly doped to NPN arrangement in such a manner as to constitute a mesa transistor configuration. While the principles of the invention apply to contacts for silicon transistors broadly regardless of their particular geometric configuration, the mesa configuration is illustrated in the drawings because the advantage of rapid and economical production which the invention provides compared to the prior art aluminum contact art are best appreciated in the several configurations which, like the mesa, are easily adaptable to multi-unit formation with masking techniques for contact application.

The techniques for producing a mesa configuration such as that forming the illustrative wafer 11 are well known to the art. Briefly referring to FIGS. 1 and 3, one technique first produces a graded region 12*a* of P-type by diffusion of an appropriate vapor, for example, boron, into an N-type silicon wafer 11*a* shown in FIG. 3 and having many times the lateral dimensions of wafer 11 illustrated in FIG. 1. After proper masking, the wafer 11*a* has N-type regions 14*a* created in selected unmasked areas in the P-type region 12*a* by diffusion of an appropriate vapor, for example, phosphorus, onto the wafer 11*a*. Contacts 20*a*, 21*a* and 22*a* may then be applied as taught hereinbelow and the wafer 11*a* of FIG. 3 may be cut into a predetermined number of individual doped NPN wafers 11 with contacts already thereon as shown in FIG. 1. Although it is not preferred, the individual wafers 11 may alternatively be first fabricated from the master wafer 11*a* and then the contacts may be added.

Referring particularly to FIG. 1, it will be apparent that wafer 11 constitutes a small portion of wafer 11*a* which has been cut so as to include an N-type region 13 corresponding to portion 13*a*, a diffused P-type region 12 corresponding to portion 12*a*, a junction 15 between regions 12 and 13, a diffused N-type region 14 corresponding to portions 14*a*, and a junction 16 between regions 12 and 14. Affixed to region 12 which constitutes the base, is contact 22 corresponding to contacts 22*a*. Similarly affixed to regions 13 and 14, constituting the collector and emitter respectively, are contacts 20 and 21 corresponding to contacts 20*a* and 21*a*. Bonded to contacts 20, 21, 22 are leads 23, 24, 25 respectively.

Figure 2:
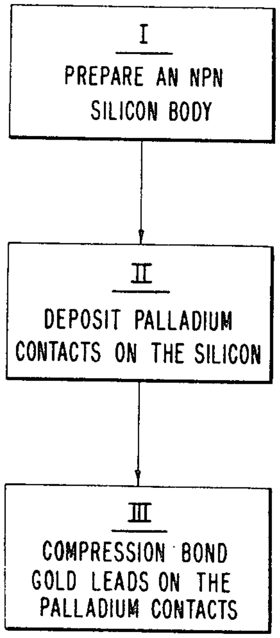
FIG. 2 is a block diagram illustrating the steps involved in fabricating the transistor according to FIG. 1.

The production of a mesa configuration wafer by the technique just described is one advantageous example of step one illustrated in FIG. 2, but any other transistor fabrication technique may alternatively be employed. However, it is a feature of the invention that ohmic contacts may be expeditiously applied to wafer 11 when it still is a portion of larger wafer 11*a*, and for that reason multi-unit wafer configurations are advantageous.

In the prior art, aluminum contacts were employed to form ohmic contacts with silicon, but because of undesirable alloying which impairs the junction at the necessary silicon substrate temperature of approximately 1100° F., aluminum contacts could not be evaporated and had to be formed instead by expensive selective removal techniques. In the present invention, particularly when a geometric configuration easily adaptable to multi-unit production such as the mesa is employed, the contacts may be applied en masse to wafer 11*a* by properly masking and evaporating the contact metal thereon as shown in FIGS. 1 and 3.

Figure 3:
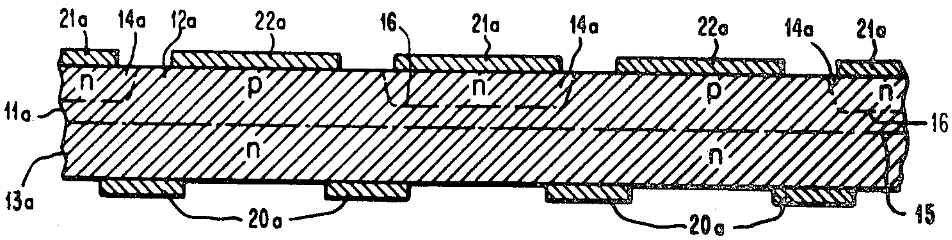
FIG. 3 is a partially sectioned view of a complex silicon wafer before it has been cut into a plurality of transistors according to FIG. 1.

Specifically, with reference to FIGS. 1, 2 and 3, it is preferred that the contacts be applied to wafer 11*a* before it is cut into multiples of wafer 11. Clearly in some forms of construction the opportunity for constructing contacts en masse will not present itself. Where it does, it is preferred, and accordingly step two in FIG. 2 constitutes the application of palladium metal vapor through a mask to wafer 11*a* so as to form the aforesaid contacts, 20*a*, 21*a*, 22*a* which on cut-down wafer 11 correspond to contacts 20, 21, 22. The deposit of palladium on wafer 11*a* may proceed by the usual well known procedures, such as for example, evaporation of the palladium from a tungsten filament, electroplating, and sputtering. Evaporation is, however, preferred in this art, and it is important to the superiority of the invention over the prior art that palladium may be evaporated onto a silicon substrate maintained at only 400° F., which is 700° F. below the 1100° F. required with aluminum. Since the deposit of palladium contacts 20*a*, 21*a*, 22*a* proceeds at this low 400° F. temperature, which is far below the palladium-silicon eutectic temperature of 1530° F., no deleterious alloying results to damage junction 15 or particularly junction 16. It will be apparent that palladium contacts 20*a*, 21*a*, 22*a*, allow higher reliability production with faster, simpler en masse masking deposition techniques, than does aluminum contacts.

However, in addition, palladium induces deep acceptor levels in silicon, specifically it induces an acceptor level at 3.4 electron volts above the valence band. Thus in addition to forming an ohmic contact with silicon as good as that formed by aluminum, palladium prevents N-type areas 13 and 14, particularly area 14, from losing its N-type doping during subsequent processing. This is a serious problem in diffused junction transistor fabrication including where aluminum contacts are employed. For this reason, the invention is particularly advantageous in NPN silicon transistors, but of course, it may also be employed with PNP silicon transistors.

The combination of advantages and effects induced by palladium with silicon, especially N-type silicon, is indeed surprising, for there has been no prior art suggestion of such possibilities. It had been thought that aluminum, although it had serious fabricating and use restrictions, was nevertheless worth the trouble because of its ohmic properties as a contact for silicon. No such completely ideal substitute for the widely used aluminum contacts was predicted from theoretical considerations.

But in addition to the aforesaid breakthrough in combined properties, another problem with aluminum has been solved. The high temperature attributes of silicon devices were heretofore compromised by the silicon-aluminum eutectic temperature of 1070° F., already mentioned, in that subsequent processing after contact formation could not exceed that temperature if mechanical strength were not to be lost nor deleterious alloying to be encountered. In addition, the same temperature limitation and the same problems when that temperature was exceeded occur in use of the completed transistor. Since the silicon-palladium eutectic temperature is 1530° F., a whole new range of almost 500° F. extra is opened up to the designer for fabrication and use temperatures by employment of palladium contacts instead of aluminum contacts.

After the palladium contacts 20*a*, 21*a*, 22*a* have been deposited on wafer 11*a*, and preferably after wafer 11*a* has been cut into a plurality of wafers similar to wafer 11, contact leads 23, 24, 25 are applied. It is well known that compression bonded gold leads are advantageous. However, when aluminum contacts are employed to obtain ohmic contact to silicon, gold leads form a mechanically and electrically fragile compression bond to aluminum, the interface exhibiting what is known in the art as the purple plaque. It is a feature of the invention that in addition to the aforesaid breakthrough in combined properties over aluminum, gold leads compression bond to palladium to form a secure joint. Thus as shown in step three of FIG. 2, gold leads 23, 24, 25 of FIG. 1 are compression bonded to contacts 20, 21, 22 respectively by well known techniques.

What has been described, with reference to FIGS. 1, 2, and 3, is a silicon transistor device, wherein ohmic contacts thereto are formed of palladium, and whereby metal mask evaporation may be employed to produce said contacts without deleterious alloying of the transistor junctions, and additionally wherein deep acceptor levels are induced in the N-type region by the palladium, high processing and use temperatures are made possible, and gold compression bonded leads do not exhibit the purple plague; all combining so that ohmic contacts to silicon are for the first time possible with reliability in processing and use, and with the uncompromised manufacturing economy of which the art is capable.

Figure 4:
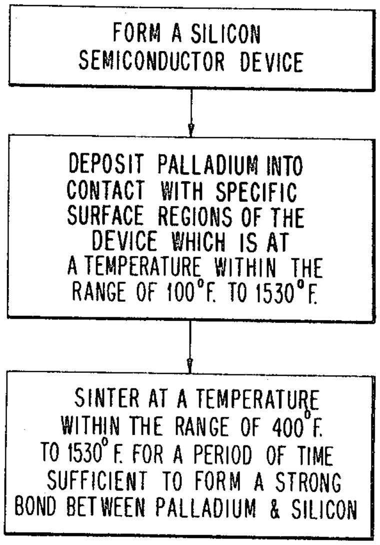
FIG. 4 is a block diagram illustrating the steps in fabricating an ohmic contact in accordance with the invention.

With reference to FIG. 4, in practicing the teachings of this invention an even stronger ohmic contact can be fabricated by a two step heating process. After palladium has been deposited on the designated regions of the silicon semiconductor surface where the semiconductor surface is kept at preferably a temperature of approximately 400° F., better adhesion to the semiconductor surface can be obtained by a second heating operation at a temperature below the aluminum-silicon eutectic temperature for a period of time sufficient to form a good bond between the palladium and silicon.

Palladium can be initially deposited to a thickness on the order of one micron on the designated portions of the silicon semiconductor surface with the silicon body being kept at a temperature within the range of 100° F. to 1530° F. to form a palladium ohmic contact. However, in order to form a stronger mechanical bond, a second heating operation is carried out with the semiconductor surface kept at a sintering temperature preferably within the range of 400° F. to 1530° F. and, more desirably, at approximately 932° F. The palladium-silicon bond is believed to be formed by a solid state diffusion between palladium and silicon. This sintering heat treatment step is carried out preferably for a period of ten minutes within this temperature range in either a vacuum, a nonoxidizing atmosphere or an oxidizing atmosphere. Subsequently, gold leads can be compression bonded to each palladium contact.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A semiconductor device comprising:
a silicon body, and at least one contact bonded thereto,
said contact consisting of palladium metal formed at a temperature of less than the silicon-palladium eutectic temperature and exhibiting substantially ohmic properties therewith,
said silicon body having at least one N-type region and at least one P-type region,
each said palladium contact being bonded to each of said regions, and
a gold lead is compression bonded in situ to each said contact.

2. A method for forming ohmic contacts to a silicon body comprising the steps of:
depositing metal onto specific regions of said silicon body while maintaining said silicon body below the eutectic alloy temperature of said metal and said silicon body at a temperature within the range of 100° F. to 1530° F. for forming an ohmic contact, and
heating the said silicon body and the said metal to a sintering temperature below the eutectic alloy temperature of said metal and said silicon body within the range of 400° F. to 1530° F. for a period of time sufficient to form a strong bond between the said metal and the said silicon body.

3. The method of claim 2 wherein the depositing step is by vacuum deposition and said metal deposited is composed of a single metal.

4. A method in accordance with claim 2, in which said ohmic contact material being palladium.

5. A method in accordance with claim 4, with the additional step of compression bonding a gold lead in situ to each palladium contact.

6. A method in accordance with claim 4, wherein said heating step is carried out at a temperature of approximately 932° F. for a period of approximately 10 minutes said palladium deposition step being carried out with said silicon body being at a temperature of approximately 400° F.

References Cited

UNITED STATES PATENTS

| | | | |
|---|---|---|---|
| 3,261,075 | 7/1966 | Carman. | |
| 3,204,321 | 9/1965 | Kile. | |
| 3,328,216 | 6/1967 | Brown | 148—187 |

JOHN W. HUCKERT, *Primary Examiner.*

M. EDLOW, *Assistant Examiner.*

U.S. Cl. X.R.

29—590; 117—212; 317—235